(12) United States Patent
Bleim et al.

(10) Patent No.: US 6,370,257 B1
(45) Date of Patent: Apr. 9, 2002

(54) APPARATUS INCLUDING AN ELECTROACOUSTIC TRANSDUCER HAVING TERMINAL CONTACTS WHICH EXTEND IN THE DIRECTION OF THE TRANSDUCER AXIS AND INCLUDING A PRINTED CIRCUIT BOARD HAVING MATING CONTACTS

(75) Inventors: Peter Bleim, Vienna; Ewald Frasl, Biedermannsdorf; Erich Klein, Himberg; Ernst Ruberl, Guntramsdorf, all of (AT)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/517,725

(22) Filed: Mar. 2, 2000

(30) Foreign Application Priority Data

Mar. 10, 1999 (EP) ............................ 99890083

(51) Int. Cl.⁷ .............................................. H04R 25/00
(52) U.S. Cl. ...................... 381/409; 381/410; 381/412; 381/396; 439/39; 439/40
(58) Field of Search ................................. 381/409, 410, 381/400, 412, 396; 439/38–40, 44, 45, 78

(56) References Cited

U.S. PATENT DOCUMENTS 3,917,914 A * 11/1975 Parker ..................... 179/115
6,111,971 A * 8/2000 Imahori et al. ............ 381/412

FOREIGN PATENT DOCUMENTS

WO   WO9838832   9/1998   ........... H04N/1/06

* cited by examiner

Primary Examiner—Huyen Le
Assistant Examiner—Dionne N. Harvey

(57) ABSTRACT

In an apparatus (1) having an electroacoustic transducer (14) and having a printed circuit board (51) the electroacoustic transducer (14) has two terminal contact elements (36, 37) and the printed circuit board (51) has two mating contact elements (52, 53), which terminal contact elements (36, 37) have two terminal contact portions (38, 39) which are oriented parallel to the transducer axis (34) of the transducer (14) and which mating contact elements (52, 53) have two mating contact portions (56, 57) which are oriented parallel to the transducer axis (34), the terminal contact portions (38, 39) and the mating contact portions (56, 57) being held pairwise against each other in a direction transverse to the transducer axis (34) and thus forming at least parts of a retainer (72) with the aid of which the transducer (14) is secured to the printed circuit board (51).

26 Claims, 3 Drawing Sheets

APPARATUS INCLUDING AN ELECTROACOUSTIC TRANSDUCER HAVING TERMINAL CONTACTS WHICH EXTEND IN THE DIRECTION OF THE TRANSDUCER AXIS AND INCLUDING A PRINTED CIRCUIT BOARD HAVING MATING CONTACTS

BACKGROUND OF THE INVENTION

1. Field of the Invention

Apparatus including an electroacoustic transducer having terminal contacts which extend in the direction of the transducer axis and including a printed circuit board having mating contacts.

The invention relates to an apparatus having a housing and an electroacoustic transducer accommodated in the housing, the transducer having a diaphragm, a moving coil connected to the diaphragm, and a magnet system adapted to cooperate with the moving coil, the magnet system being coaxial with a transducer axis of the transducer, and surrounding an inner space which is coaxial with the transducer axis, and the transducer having two terminal contact elements each serving for the electrically conductive connection to a moving coil lead of the moving coil, and being disposed at least partly inside the inner space in the magnet system, and extending at least partly parallel to the transducer axis, and the apparatus further including a printed circuit board accommodated in the housing and provided with two mating contacts which are each in mechanical contact with and have an electrically conductive connection to a terminal contact element.

The invention also relates to an electroacoustic transducer for use in such an apparatus.

2. Description of the Related Art

An apparatus and an electroacoustic transducer, as described above are commercially available and are consequently known. For the known constructions reference can be made to International Patent Application WO 98/38832 A1, corresponding to U.S. patent application Ser. No. 09/033,200, filed Mar. 2, 1999. In the known constructions, the electroacoustic transducer, is secured to the housing of the known apparatus with the aid of fixing means. Furthermore, the printed circuit board is also secured to the housing, or to stationary parts connected to the housing, with the aid of further fixing means. The terminal contact elements are formed by contact springs having one bend. The mating contacts are formed by conductor track areas on the printed circuit board. As long as the electroacoustic transducer is comparatively large, its outer diameter being of a magnitude larger than 10 mm, for example, between 13 mm and 40 mm, the known constructions yield satisfactory results. However, further miniaturization of an apparatus, such as the known one and an electroacoustic transducer as the known one, gives rise to problems because terminal contact elements formed by contact springs having one bend and mating contacts formed by conductor track areas on the printed circuit board establish a proper electrically conductive connection only if the construction of the housing and the construction of the printed circuit board are within comparatively narrow tolerance limits, because the terminal contact elements having one bend only enable a limited compensation for tolerances of the aforementioned type. Moreover, it is to be noted that the terminal contact elements in the form of contact springs having one bend which, as stated, have been provided in the International Patent Application WO 98/38832 A1, can be miniaturized only to a limited extent and can, therefore, no longer be used in transducers which are further miniaturized in comparison with the known transducer.

SUMMARY OF THE INVENTION

It is an object of the invention to preclude the aforementioned problems and to provide an improved apparatus and an improved electroacoustic transducer in which, also in the case of further miniaturization, always a trouble-free and substantially tolerance-independent electrical connection is obtained between two terminal contact elements of the transducer and two mating contact elements on a printed circuit board.

In order to achieve the aforementioned object, according to the invention, the apparatus as described above is characterized in that two mating contact elements are provided as mating contacts which are separate from the printed circuit board, the two separate mating contact elements being mechanically connected to the printed circuit board, and each having a mating contact portion which extends substantially parallel to the transducer axis, and a terminal contact portion which extends also substantially parallel to the transducer axis and is in contact with a mating contact portion which extends parallel to the transducer axis, the terminal contact portions and the mating contact portions being held pairwise against each other in a direction transverse to the transducer axis and thus forming at least parts of retaining means for securing the transducer to the printed circuit board.

Further in order to achieve the aforementioned object, according to the invention, the transducer as described above is characterized in that the two terminal contact elements each have a terminal contact portion which extends also substantially parallel to the transducer axis and which forms a part of retaining means for securing the transducer to a printed circuit board, this part acting in a direction which is oriented transversely to the transducer axis.

By means of the measures in accordance with the invention, it is achieved, in a simple manner and at only low cost, that between the two terminal contact elements of a transducer in accordance with the invention, and the two mating contact elements on the printed circuit board in an apparatus in accordance with the invention, always a trouble-free electrical connection which is substantially independent of component tolerances is guaranteed, also in the case that the apparatus and the transducer are comparatively small and the transducer has an outer diameter of a magnitude smaller that 10 mm, for example, of a magnitude between 5 mm and 10 mm. Moreover, it is thus achieved that an electroacoustic transducer in accordance with the invention is secured directly to the printed circuit board of an apparatus in accordance with the invention by simple means, and that the transducer in accordance with the invention can be mounted on and secured to the printed circuit board before the housing of the apparatus is closed, which has the advantage of a simple mounting and of a simple testing of the formation of the electrically conductive connections between the terminal contact elements and the mating contact elements.

In an apparatus in accordance with the invention, a terminal contact portion and a mating contact portion may cooperate with each other, for example, only under the influence of friction, and may thus be held against each other in a direction transverse to the transducer axis and thereby perform a retaining function with the aid of which the transducer in accordance with the invention is secured to the printed circuit board. However, it has very advantageous that, in addition, at least one contact portion of a contact portion pair, consisting of a terminal contact portion and a mating contact portion, is resilient in a direction which is oriented transversely to the transducer axis, because in this way, a particularly reliable electrical contact is established, and also a proper mechanical fastening of the transducer in accordance with the invention to the printed circuit board is achieved. Likewise, it has proven to be advantageous that, in the terminal contact portions are resilient in a direction which is oriented transversely to the transducer axis.

In an apparatus in accordance with the invention, it has proven to be very advantageous that the two mating contact elements consist of a material which is resistant to temperatures prevalent during soldering processes. because it is thus guaranteed that the mating contact elements can be connected to the printed circuit board both electrically and mechanically by an arbitrary solder process without any damage as a result of high-temperature effects.

In an apparatus in accordance with the invention, two mating contact elements may be provided, which are each mechanically connected to the printed circuit board without any further means. However, it has proven to be particularly advantageous that, in an apparatus in accordance with the invention, the two mating contact elements are disposed, at least for the greater part, in a mating contact element holder at least in the area of their mating contact portions, and the mating contact portions are arranged to be accessible for the terminal contact portions of the terminal contact elements without being hindered by the mating contact element holder, and the mating contact element holder is mechanically connected to the printed circuit board. This results in a very high mechanical stability and a proper protection for the mating contact elements.

In an apparatus in accordance with the invention having a mating contact element holder, it has proven to be particularly advantageous that the printed circuit board has a hole which traverses the printed circuit board, and the mating contact element holder is mounted in the hole, because such a construction has a particularly small overall height in the direction of the transducer axis of the transducer.

In an apparatus in accordance with the invention as mentioned in the preceding paragraph, it has proven to be particularly advantageous that, in addition, the mating contact element holder mounted in the hole of the printed circuit board is connected to the printed circuit board by means of a press-fit, because this results in a particularly simple mechanical connection between the mating contact element and the printed circuit board.

In an apparatus in accordance with the invention having a mating contact element holder, it has further proven to be advantageous that, in addition, each mating contact portion has a solder portion for connecting the mating contact portion to a conductor track area of the printed circuit board in an electrically conductive manner with the aid of a soldered joint. Thus, it is simply possible to form both an electrically conductive connection and a mechanically stable connection between each mating contact element and a conductor track area of the printed circuit board.

In an apparatus in accordance with the invention it has further proven to be particularly advantageous that, in addition, the two terminal contact elements are disposed, at least for the greater part, in a terminal contact element holder at least in the area of their terminal contact portions, and the terminal contact portions are arranged to be accessible for the mating contact portions of the two mating contact elements without being hindered by the terminal contact element holder, and the terminal contact element holder is connected to the magnet system of the transducer inside the inner space of the magnet system. Such a construction also provides a high mechanical stability and a proper protection for the terminal contact elements of a transducer in accordance with the invention. Likewise, it has proven to be advantageous, in a transducer in accordance with the invention, that the two terminal contact elements are disposed, at least for the greater part, in a terminal contact element holder at least in the area of their terminal contact portions, and the terminal contact portions are arranged to be accessible without being hindered by the terminal contact element holder, and the terminal contact element holder is connected to the magnet system of the transducer inside the inner space of the magnet system.

In an apparatus in accordance with the invention, it has proven to be highly advantageous that, in addition, the mating contact element holder and the terminal contact element holder form parts of mechanical retaining means for retaining the transducer on the printed circuit board, and the terminal contact portions of the two terminal contact elements and the mating contact portions of the two mating contact elements in addition form parts of said retaining means and enhance the retaining function of the mating contact element holder and the terminal contact element holder, because in this way the mating contact element holder and the terminal contact element holder are used not only to support and protect the mating contact elements and the terminal contact elements but also to secure a transducer in accordance with the invention to the printed circuit board of an apparatus in accordance with the invention in a stable and reliable manner. Likewise, it has proven to be highly advantageous, in a transducer in accordance with the invention, that the terminal contact element holder forms a part of mechanical retaining means for retaining the transducer on a printed circuit board, and the terminal contact portions of the two terminal contact elements in addition form parts of said retaining means and enhance the retaining function of the terminal contact element holder.

In an apparatus in accordance with the invention of the construction mentioned in the preceding paragraph, it has further proven to be very advantageous that, in addition, the terminal contact element holder is plugged onto the mating contact element holder, and the two element holders are held together under the influence of friction, results in a satisfactory and trouble-free retaining function as well as a high degree of simplicity.

In an apparatus in accordance with the invention, it has further proven to be very advantageous that, in addition, the terminal contact element holder, in addition, is adapted to retain the parts of the magnet system of the transducer axially and to position said parts radially. Likewise, it has proven to be very advantageous, in a transducer in accordance with the invention, that the terminal contact element holder, in addition, is adapted to position the parts of the magnet system of the transducer radially. This because in this case the terminal contact element holder performs additional function, which is advantageous for a simplified construction.

In an apparatus in accordance with the invention it has proven to be particularly advantageous that, in addition, the two terminal contact elements and the two mating contact elements are arranged to be coaxial with each other. Likewise, it has proven to be particularly advantageous, in a transducer in accordance with the invention, that the two terminal contact elements are arranged to be coaxial with each other. These coaxial constructions are of particularly great advantage because it is thus achieved, in a very simple manner, that, during mounting of the transducer in accordance with the invention on the printed circuit board of an apparatus in accordance with the invention, the transducer need not be in a well-defined position, but the transducer can be placed with terminal contact elements onto the mating contact elements of the printed circuit board in an arbitrary angular position of the transducer with respect to the printed circuit board.

The above-mentioned as well as further aspects of the invention will become apparent from the examples of embodiments described hereinafter and will be elucidated with reference to these examples.

BRIEF DESCRIPTION OF THE DRAWINGS

The invention will now be described in more detail with reference to the drawings, which shows four embodiments given by way of example but to which the invention is not limited, in which.

DESCRIPTION OF THE PREFERRED EMBODIMENTS

Figure 1:
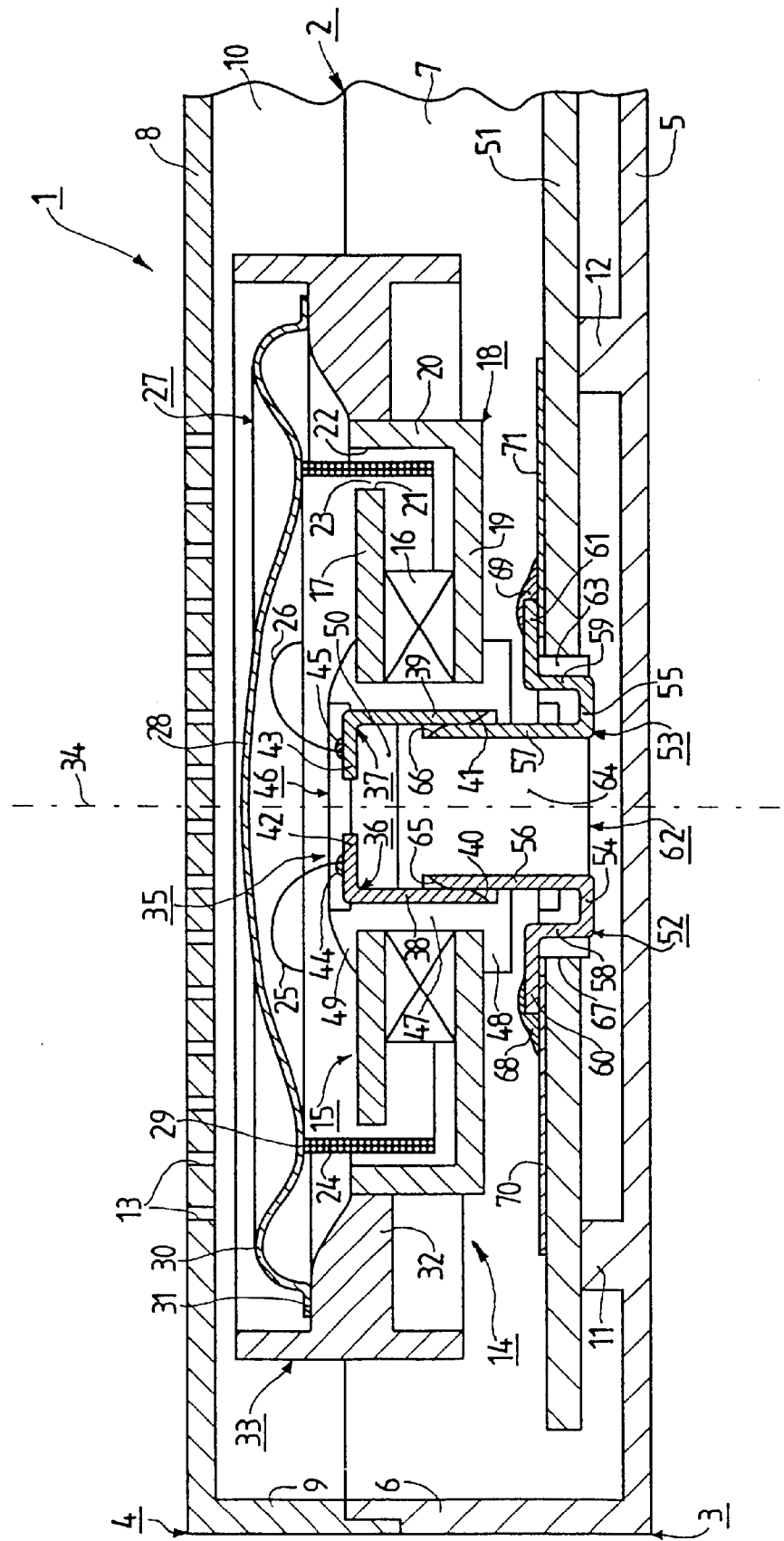
FIG. 1 is a cross-sectional view, enlarged to 20 times full scale, showing a part of an apparatus in accordance with the invention in a first embodiment of the invention including a transducer in accordance with the invention in a first embodiment of the invention, the cross-sectional view being taken at the transducer axis of the transducer.

FIG. 1 shows an apparatus 1 which takes the form of a so-called mobile telephone. The apparatus I has a housing 2 comprising a first housing half 3 and a second housing half 4. A bottom wall 5, a short side wall 6 and a long side wall 7 of the first housing half 3 are shown in FIG. 1. An upper wall 8, a short side wall 9 and a long side wall 10 of the second housing half 4 are also shown in FIG. 1. The bottom wall 5 has two ribs 11 and 12 whose purpose will be described in detail hereinafter. The upper wall 8 has a multiplicity of sound transmission apertures 13.

The housing 2 accommodates an electroacoustic transducer 14. The transducer 14 is an electrodynamic loudspeaker. The transducer 14 has a magnet system 15 comprising a magnet 16, an annular first yoke 17, often referred to as pole plate, and a pot-shaped second yoke 18, the second yoke 18 consisting of an annular bottom part 19 and a hollow cylindrical circumferential part 20. Between the circumferential end surface 21 of the first yoke 17 and the inner end surface 22 of the circumferential part 20, which end surface 22 faces said end surface 21, an air gap 23 is formed. A part of a moving coil 24, with which the magnet system 15 cooperates, is disposed in the air gap 23. Two moving coil leads 25 and 26, formed by connection wires, lead away from the moving coil 24.

The transducer 14 further has a diaphragm 27 having a dome-shaped central portion 28, an essentially flat narrow annular mounting portion 29, which adjoins the central portion 28, an annular corrugated movable portion 30, and a flat annular peripheral portion 31, which adjoins the movable portion 30. The peripheral portion 31 connects the diaphragm 27 to an annular mounting portion 32 of a diaphragm holder 33. The diaphragm holder 33 itself is secured to the circumferential part 20 of the second yoke 18 of the magnet system by its mounting portion 32, which is effected by means of a press-fit. However, alternatively, the mounting portion 32 may be connected to the circumferential part 20 of the second yoke 18 by means of an adhesive joint. The moving coil 24 is attached to the narrow flat mounting portion 29 of the diaphragm 27, which is effected by means of an adhesive joint (not shown). In this way, the reciprocating excursions performed by the energized moving coil 24, parallel to the direction of a transducer axis 34 during operation and impressed on the moving coil as a result of its cooperation with the magnet system 15, can be transmitted to the diaphragm 27.

It is to be noted that both the magnet system 15 and its parts 16, 17 and 18, as well as the diaphragm 27 and the moving coil 24, are exactly coaxial with the transducer axis 34.

As is apparent from FIG. 1, the magnet system 14 is hollow cylindrical, as a result of which, the magnet system 15 encloses an inner space 35 which is coaxial with the transducer axis 35. A first terminal contact element 36 and a second terminal contact element 37 of the transducer 14 are, for the greater part, disposed in the area of the inner space 35. In the present case, the two terminal contact elements 36 and 37 are each L-shaped and extend partly parallel to the transducer axis 34. Each of the two terminal contact elements 36 and 37 has a respective first limb 38 or 39, which extends parallel to the transducer axis 34 and which has a bevel, 40 or 41, at its free end. Furthermore, each of the two terminal contact elements 36 and 37 has a respective second limb 42 or 43, which extends perpendicularly to the transducer axis 34. The two terminal contact elements 36 and 37 of the transducer 14 serve for the electrically conductive connection to a respective moving coil lead 25 or 26 of the moving coil 24. As is apparent from FIG. 1, the first moving coil lead 25 is connected to the second limb 42 of the first terminal contact element 36 by means of a soldered joint 44. Likewise, the second moving coil lead 26 is connected to the second limb 43 of the second terminal contact element 37 by means of a soldered joint 45.

The two first limbs 38 and 39 of the two terminal contact elements 36 and 37 each form respective terminal contact portions 38 and 39 of the two terminal contact elements 36 and 37, which portions extend parallel to the transducer axis 34. The two terminal contact elements 36 and 37 are disposed in a terminal contact element holder 46 in the area of their terminal contact portions 38 and 39, i.e., in the area of their respective first limbs 38 and 39, and also in the area of their respective second limbs 42 and 43. The terminal contact element holder 46 consists of a hollow cylindrical tubular part 47 which, at its side which is remote from the diaphragm 27, carries an annular first flange 48, and, at its side which faces the diaphragm 27, carries a second flange 49 which tapers outwardly and is formed by ultrasonic welding, and, at its side which faces the diaphragm 27, is closed by a bottom part 50. The terminal contact elements 36 and 37 are arranged in the terminal contact element holder 46 in such a manner that the two terminal contact portions 38 and 39, formed by the two respective first limbs 38 and 39, are accessible from the interior of the terminal contact element holder 46 without hindrance by the terminal contact element holder 46.

The terminal contact element holder 46 is connected to the magnet system 15 of the transducer 14 inside the inner space 35 of the magnet system 15. The terminal contact element holder 46 has such a construction that the terminal contact element holder 46 is adapted to provide not only a holding function and a protective function for the terminal contact elements 36 and 37 but also to position the parts 16, 17 and 18 of the magnet system 15 of the transducer 14 radially and to retain these parts axially. Radial positioning is effected by means of the tube 47 of the terminal contact element holder 46. Axial retainment is achieved by means of the first flange 48 and the second flange 49 of the terminal contact element holder 46.

The apparatus 1 further includes a printed circuit board 51 accommodated in the housing 2. In a manner not shown, the printed circuit board 51 is connected to the two ribs 11 and 12, which are integral with the bottom wall 5 of the housing 2. The printed circuit board 51 is shown only partly.

The printed circuit board 51 carries two mating contacts which are each in contact with and electrically connected to a respective terminal contact element 36 or 37. Advantageously, the construction used in the apparatus 1 is such that the mating contacts comprise a first mating contact element 52 which is separate from the printed circuit board 51 and a second mating contact element 53 which is also separate from the printed circuit board 51. The two separate mating contact elements 52 and 53 are mechanically connected to the printed circuit board 51, which will be described in detail hereinafter.

In the present case the two mating contact elements 52 and 53 each have a respective limb 54 or 55 which extends perpendicularly to the transducer axis 34, a respective long limb 56 or 57 which is connected to the respective limb 54 or 55 and which projects perpendicularly from the limb 54 or 55 and consequently extends parallel to the direction of the transducer axis 34, a respective short limb 58 or 59 of a construction similar to that of the long limbs 56 and 57, and finally a solder portion 60 or 61 which projects laterally from each respective short limb 58 or 59 and consequently extends perpendicularly to the transducer axis 34. Each of the two long limbs 56 and 57, respectively, forms a mating contact portion 56 or 57 of the mating contact elements 52 and 53, respectively.

The two mating contact elements 52 and 53 are disposed in a mating contact element holder 62 in the area of their mating contact portions 56 and 57, which are each formed by a respective one of the long limbs 56 and 57. The mating contact element holder 62 consists of an essentially disc-shaped lower part 63 and of an upper part 64 which projects from the lower part 63 towards the transducer 14 in a direction parallel to the transducer axis 34. The upper part 64 accommodates the long limbs 56 and 57 which form the mating contact portions 56 and 57 of the mating contact elements 52 and 53, namely, in such a manner that the mating contact portions 56 and 57 are arranged to be accessible in radial directions from outside the mating contact element holder 62 without being hindered by the mating contact element holder 62. Thus, the mating contact portions 56 and 57 are also accessible without hindrance for the terminal contact portions 38 and 39 of the terminal contact elements 36 and 37. Conversely, the terminal contact portions 38 and 39 of the terminal contact elements 36 and 37 are also accessible without hindrance for the mating contact portions 56 and 57 of the mating contact elements 52 and 53. The mating contact portions 56 and 57, i.e., the long limbs 56 and 57 of the mating contact elements 52 and 53, each have a bevel 65 or 66 in the area of their respective free ends.

The mating contact element holder 62 is mechanically connected to the printed circuit board 15, as a result of which, the two separate mating contact elements 52 and 53 are also mechanically connected to the printed circuit board 51. In the present case, the mechanical connection between the mating contact element holder 62 and the printed circuit board 51 is advantageously obtained in that the printed circuit board 51 has a hole 67 which traverses the printed circuit board 51, and in that the mating contact element holder 62 is mounted in this hole 67. The mating contact element holder 62 mounted in the hole 67 in the 30 printed circuit board 51 is secured to the printed circuit board 51 by means of a press-fit. In addition, an adhesive joint may be provided between the mating contact element holder 62 and the printed circuit board 51.

As already stated, each mating contact element 52 or 53 has a solder portion, 60 or 61, respectively. By means of the respective solder portion 60 or 61, the relevant mating contact element 52 or 53 is connected to a conductor track area 70 or 71 of the printed circuit board 51 in an electrically conductive manner with the aid of a respective soldered joint 68 or 69. It is to be noted that the mating contact elements 52 and 53 may also be connected to connection wires in an electrically conductive manner in the area of their limbs 54 and 55 with the aid of a soldered joint, these connection wires being connected in an electrically conductive manner either to conductor track areas of the printed circuit board 51 or to conductor track areas of another printed circuit board.

As regards the two mating contact elements 52 and 53, it is to be noted that the two mating contact elements 52 and 53 consist of a material which can withstand temperatures prevalent during soldering processes. Thus, the two mating contact elements 52 and 53 are made of a material which is resistant to high temperatures, for example, surface-treated spring bronze, so that the soldered joints 66 and 67 can be made in a customary soldering process in which other parts on the printed circuit board 51 are also connected to conductor track areas of the printed circuit board 51 with the aid of soldered joints.

In the apparatus 1 and in the transducer 14, the construction is suitably such that the two terminal contact elements 36 and 37, with their terminal contact portions 38 and 39, which extend parallel to the transducer axis, are each in contact with a respective one of the mating contact portions 56 and 57 of the two mating contact elements 52 and 53, these mating contact portions extending also parallel to the transducer axis 34, and that the terminal contact portions 38, 39 and the mating contact portions 56, 57 are then held pairwise against each other in a direction transverse to the transducer axis 34, and thus form at least parts of retaining means 72 with the aid of which the transducer 14 is secured to the printed circuit board 51. In the embodiment shown in FIG. 1, the terminal contact portions 38, 39 and the mating contact portions 56, 57 are held pairwise against each other with the aid of the terminal contact element holder 46 and the mating contact element holder 62, these two holders 46 and 62 radially supporting the terminal contact portions 38, 39 and the mating contact portions 56, 57 in such a manner that the terminal contact portions 38, 39 and the mating contact portions 56, 57 frictionally cooperate with each other and thus perform a retaining function for retaining the transducer 14 on the printed circuit board 51, or support such a retaining function.

In the apparatus 1 and the transducer 14 shown in FIG. 1, the mating contact element holder 62 and the terminal contact element holder 46 form parts of the mechanical retaining means 72 for securing the transducer 14 to the printed circuit board 51. The terminal contact element holder 46 is then plugged with its tubular part 47 onto the mating contact element holder 62, i.e., onto the top part 64 of the mating contact element holder 62. The two holders 46 and 62 are held together under the influence of friction, as a result of which a very reliable retaining function is obtained, because the mass of the transducer 14 is small due to its small dimensions. A satisfactory retaining function is also guaranteed because, in addition, the terminal contact portions 38 and 39 of the two terminal contact elements 36 and 37 and the mating contact portions 56 and 57 of the two mating contact elements 52 and 53 form parts of said retaining means 72, and thus enhance the retaining function of the mating contact element holder 62 and of the terminal contact element holder 46.

During the manufacture of the apparatus 1, the printed circuit board 51 is connected to the ribs 11 and 12 of the bottom wall 5 of the housing 2. The mating contact element holder 62 including the mating contact elements 52 and 53 is then already mechanically connected to the printed circuit board 51 and the solder portions 60 and 61 of the mating contact elements 52 and 53 have an electrically conductive connection with the conductor track areas 70 and 71 of the printed circuit board 51, namely, via the soldered joints 68 and 69. Subsequently, the transducer 14 is slid or placed onto the mating contact element holder 62 with its terminal contact element holder 46 parallel to the transducer axis 34, the terminal contact portions 38 and 39 and the mating contact portions 56 and 57 first sliding onto each other with their bevels 40, 41 and 65, 66 and being subsequently supported by the two element holders 46 and 62 and being consequently held against each other in a direction transverse to the transducer axis 34. Under the influence of the friction between the terminal contact portions 38, 39 and the mating contact portions 56, 57, and under the influence of the friction between the terminal contact element holder 46 and the mating contact element holder 62, namely, between the tubular portion 47 and the top portion 64, the transducer 14 is properly retained on the printed circuit board 51. The construction and alignment of the terminal contact portions 38 and 39 and of the mating contact portions 56 and 57 advantageously guarantees that always a proper electrical connection between the two terminal contact elements 36, 37 and the two mating contact elements 52, 53 is obtained which is subsequently independent of tolerances in the construction of the housing 2, the printed circuit board 51 and the transducer 14.

Figures 2, 3:
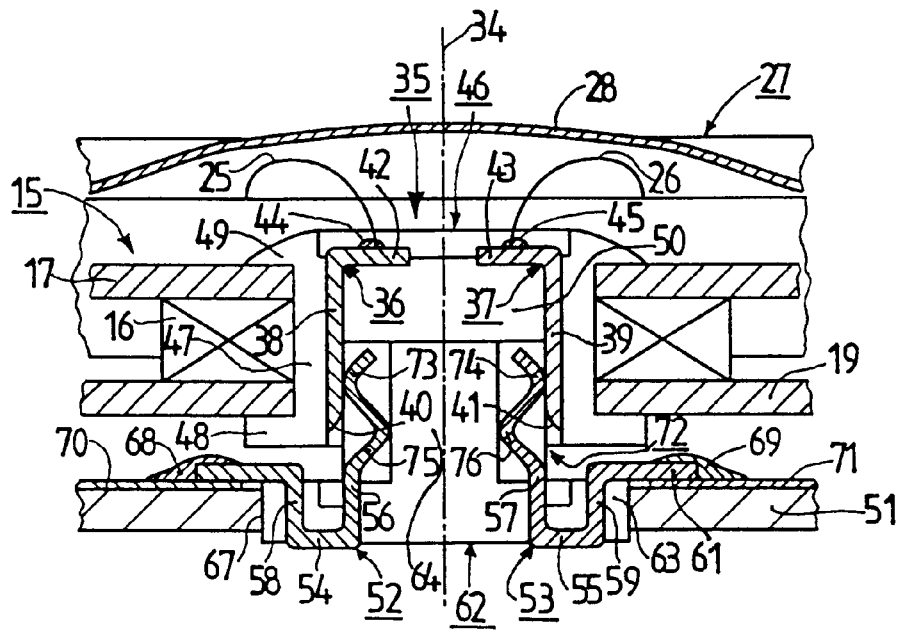
FIG. 2 is a view similar to that in FIG. 1 showing an even smaller part of an apparatus in accordance with the invention in a second embodiment of the invention and a transducer in accordance with the invention in a second embodiment of the invention.
FIG. 3 is a view similar to that in FIG. 1 showing an apparatus in accordance with the invention in a third embodiment of the invention and a transducer in accordance with the invention in a third embodiment of the invention.

As regards the embodiment shown information FIG. 2, which is a modification of the embodiment shown in FIG. 1, it is to be noted that in the present embodiment, the mating contact portions 56 and 57 of the mating contact elements 52 and 53 are each resilient in a direction transverse to the transducer axis 34. This resilient construction is obtained in that the long limbs 56 and 57, i.e., the mating contact portions 56 and 57 of the mating contact elements 52 and 53 each have a convexly curved portion, 73 and 74, respectively, and a concavely curved portion, 75 and 76, respectively, the concavely curved portions 75 and 76 serving to act against the top part 64 of the mating contact element holder 62, and the convexly curved portions 73 and 74 serving to cooperate with the first limbs 38 and 39, i.e., the terminal contact portions 38 and 39 of the terminal contact elements 36 and 37. As a result of the resilient construction, a comparatively smooth engagement of the mating contact portions 56, 57 and the terminal contact portions 38, 39 is achieved and, in addition, the retaining function is enhanced effectively.

In the embodiment shown in FIG. 3, both the mating contact portions 56 and 57, i.e., the long limbs 56 and 57 of the mating contact elements 52 and 53, as well as the terminal contact portions 38 and 38, i.e., the first limbs 38 and 39 of the terminal contact elements 36 and 37, are each curved and are resilient in a direction transverse to the transducer axis 34. Such an embodiment has also proven to be very advantageous.

As regards the embodiment shown in FIG. 3 it is to be noted that the mating contact elements 52 and 53 are essentially L-shaped, and each have a long limb 56, 57 and, in addition, a solder portion 60, 61 connected to the long limb 56, 57 and projecting radially outwards from the long limb 56, 57, the solder portions 60 and 61 being connected to conductor track areas 70 and 71 of the printed circuit board 51 by means of a soldered joint 68, 69 provided on the surface 77 of the printed circuit board 51, which is the surface remote from the transducer 14.

In the embodiment shown in FIG. 3, the mating contact elements 52 and 53 are substantially thicker than in the embodiment shown in FIGS. 1 and 2. Moreover, the mating contact elements 52 and 53 in the embodiment shown in FIG. 3 are made of a spring steel, thus enabling comparatively great forces to be applied in a direction transverse to the transducer axis by means of the mating contact elements 52 and 53, as a result of which, the transducer 14 can be attached securely to the printed circuit board 51 via the terminal contact elements 36 and 37 of the transducer 14 with the aid of said mating contact elements 52 and 53 although the embodiment shown in FIG. 3 does not have a mating contact element holder.

Figure 4:
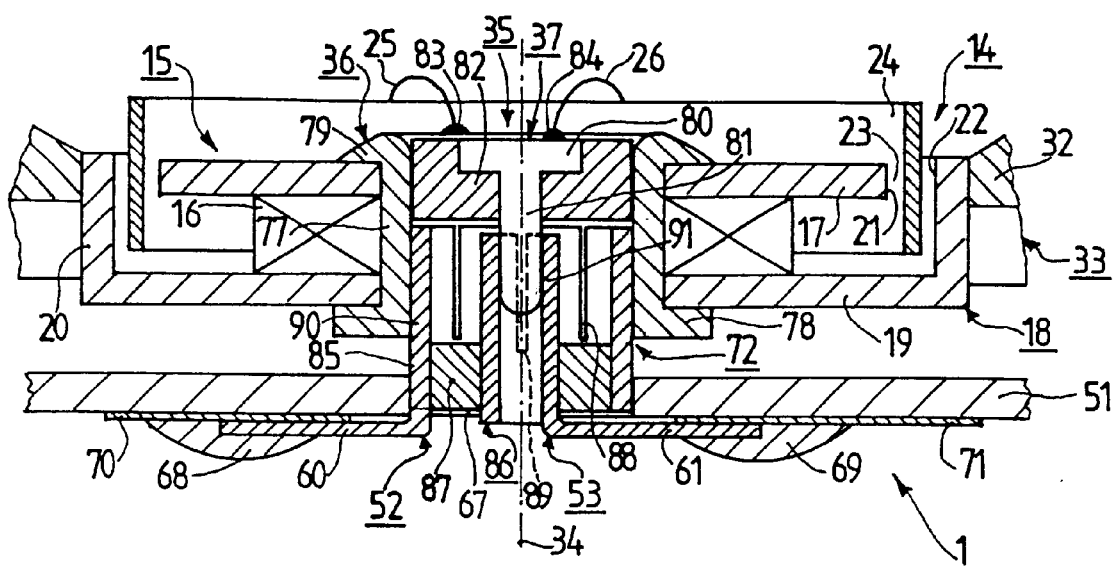
FIG. 4 is a view similar to that in FIGS. 2 and 3 showing an apparatus in accordance with the invention in a fourth embodiment of the invention and a transducer in accordance with the invention in a fourth embodiment of the invention.

In the apparatus 1 and the transducer 14 shown in FIG. 4, the two terminal contact elements 36 and 37 and the two mating contact elements 52 and 53 are arranged coaxially with one another. Furthermore, the two terminal contact elements 36 and 37 and the two mating contact elements 52 and 53 are essentially rotationally symmetrical. This has the advantage that the transducer 14 can be placed onto the mating contact elements 52 and 53 with its terminal contact elements 36 and 37 in any arbitrary angular position.

In the present case, one terminal contact element 36 has a hollow cylindrical tubular metal part 77 which positions the parts 16, 17, 18 of the magnet system 15 in a radial direction. At both ends, the tubular metal part 77 has a flange 78, 79, these flanges 78 and 79 being integral with the metal tubular part 77. The second flange 79 situated nearer the diaphragm, (not shown), is rounded and tapered in the area of its free end, which is because the second flange 79 is formed in a riveting process. The tubular metal part 77 thus forms a terminal contact portion 77 of the terminal contact element 36, this terminal contact portion extending parallel to the transducer axis 34. The other terminal contact element 37 consists of a contact disc 80 which faces the moving coil lead 26 and of a contact pin 81 which is integral with the contact disc 80. The contact pin 81 and the contact disc 80 are retained with the aid of a first plastic part 82. The first plastic part 82, in turn, is retained in the tubular metal part 77, i.e., inside the one terminal contact element 36, namely, in that the first plastic part 82 is mounted in the tubular metal part 77 by means of a press-fit.

It is to be noted that the one terminal contact element 36 is connected to the one moving coil lead 25 via the second flange 79 by means of a first soldered joint 83. The other terminal contact element 37 is connected to the other moving coil lead 26 via its contact disc 80 by means of a second soldered joint 84.

In the embodiment shown in FIG. 4, the one mating contact element 52 has a first contact tube 85 which cooperates with the tubular metal part 77. The second mating contact element 53 has a second contact tube 86 which cooperates with the contact pin 81. The second contact tube 86 is secured with the aid of a second plastic part 87, the second plastic part 87 being fastened in the first contact tube 85, which is also effected by means of a press-fit.

The first contact tube 85 has a plurality of slits 88 which extend up to the end of the first contact tube 85 nearest the first plastic part 82 and are open in the area of this end. The second contact tube 86 also has a plurality of slits 89 similar to the slits 88. By means of the slits 88 and 89, it is achieved that both the first contact tube 85 and the second contact tube 86 are resilient at the locations where they cooperate with the terminal contact elements 36 and 37, which guarantees that the terminal contact elements 36 and 37 and the mating contact elements 52 and 53 are pairwise held against each other in a direction transverse to the transducer axis 34 at the location of their cooperating contact portions, and thus form retaining means 72 with the aid of which the transducer 14 is secured to the printed circuit board 51. In the present case, the portions of the two contact tubes 85 and 86 situated at the same level as the slits 88 and 89 each form a respective mating contact portion 90, 91 of the relevant mating contact element 52, 53, these mating contact portion extending parallel to the transducer axis 34.

In the embodiment shown in FIG. 4, the printed circuit board 51 also has a hole 67 which traverses the printed circuit board 51, and the first contact tube 85 engages in the hole 67. The first contact tube 85 is fastened in the hole 67 under the influence of friction.

Both the first contact tube 85 and the second contact tube 86 each have a radially projecting solder portion 60, 61 via which the respective mating contact portion 52, 53 is connected to a respective conductor track area 70, 71 of the printed circuit board 51 in an electrically conductive manner. In this way, it is achieved that the two soldered joints 68 and 69 assist in securing the first contact tube 85 and, consequently, the respective mating contact portion 52 as well as in securing the second contact tube 86, which is connected to the first contact tube 85 via the second plastic part 87, and thus the respective mating contact element 53.

In the present case, the tubular metal part 77 and the contact pin 81 together with the portions 90 and 91 of the two contact tubes 85 and 86 form the retaining means 72 by which the transducer 14 is secured to the printed circuit board 51.

The apparatuses described with reference to FIGS. 1, 2, 3 and 4 are so-called mobile telephones. However, the measures in accordance with the invention can also be used with advantage in other apparatuses, for example, in so-called pocket dictation machines which are hand-held during operation. The embodiments described hereinbefore include a magnet system in which the air gap which cooperates with the moving coil is situated in the peripheral area of the magnet system and, consequently, the magnet 16 and the first yoke 17 are disposed inside the moving coil 24 in radial directions and the hollow cylindrical circumferential part 20 of the second yoke 18 is disposed outside the moving coil 24 in radial directions. However, the measures in accordance with the invention can also be used with advantage in apparatuses including a transducer with a magnet system having an air gap in which a moving coil is disposed and which is situated adjacent the inner space of the magnet system, which space is surrounded by the magnet system, a magnet and an annular first yoke of the magnet system being situated outside the moving coil in radial directions and a hollow cylindrical circumferential part of a second yoke of the magnet system being situated inside the moving coil in radial directions, as is known per se from the International Patent Application WO 98/38832 mentioned above, which is incorporated herewith by reference.

What is claimed is:

1. An apparatus having a housing and an electroacoustic transducer accommodated in the housing, said transducer having a diaphragm, a moving coil connected to the diaphragm, and a magnet system for cooperating with the moving coil, said magnet system being coaxial with a transducer axis of the transducer and surrounding an inner space coaxial with the transducer axis, and said transducer having two terminal contact elements each serving for the electrically conductive connection to a moving coil lead of the moving coil, and being disposed at least partly inside the inner space in the magnet system and extending at least partly parallel to the transducer axis, and said apparatus further including a printed circuit board accommodated in the housing, said circuit board having two mating contacts each in mechanical contact with and having an electrically conductive connection to a terminal contact element, characterized in that the apparatus further comprises two mating contact elements as mating contacts, said two contact elements being separate from the printed circuit board and mechanically connected to the printed circuit board extending substantially parallel to the transducer axis, and a terminal contact portion extending also substantially parallel to the transducer axis and being in contact with a mating contact portion which extends parallel to the transducer axis, the terminal contact portions and the mating contact portions being held pairwise against each other in a direction transverse to the transducer axis thus forming at least parts of retaining means for securing the transducer to the printed circuit board.

2. The apparatus as claimed in claim 1, characterized in that at least one contact portion of a contact portion pair, consisting of a terminal contact portion and a mating contact portion, is resilient in a direction oriented transversely to the transducer axis.

3. The apparatus as claimed in claim 1, characterized in that the two mating contact elements consist of a material resistant to temperatures prevalent during soldering processes.

4. The apparatus as claimed in claim 1, characterized in that the two mating contact elements are disposed, at least for the greater part, in a mating contact element holder at least in the area of their mating contact portions, and the mating contact portions are arranged to be accessible for the terminal contact portions of the terminal contact elements without being hindered by the mating contact element holder, and the mating contact element holder is mechanically connected to the printed circuit board.

5. The apparatus as claimed in claim 4, characterized in that the printed circuit board has a hole which traverses the printed circuit board, and the mating contact element holder is mounted in the hole.

6. The apparatus as claimed in claim 5, characterized in that the mating contact element holder mounted in the hole of the printed circuit board is connected to the printed circuit board by means of a press-fit.

7. The apparatus as claimed in claim 4, characterized in that each mating contact portion has a solder portion via which the mating contact portion is connected to a conductor track area of the printed circuit board in an electrically conductive manner with the aid of a soldered joint.

8. The apparatus as claimed in claim 4, characterized in that the two terminal contact elements are disposed, at least for the greater part, in a terminal contact element holder at least in the area of their terminal contact portions, and the terminal contact portions are arranged to be accessible for the mating contact portions of the two mating contact elements without being hindered by the terminal contact element holder, and the terminal contact element holder is connected to the magnet system of the transducer inside the inner space of the magnet system.

9. The apparatus as claimed in claim 8, characterized in that the mating contact element holder and the terminal contact element holder form parts of mechanical retaining means for retaining the transducer on the printed circuit board, and the terminal contact portions of the two terminal contact elements and the mating contact portions of the two mating contact elements in addition form parts of said retaining means enhancing the retaining function of the mating contact element holder and the terminal contact element holder.

10. The apparatus as claimed in claim 9, characterized in that the terminal contact element holder is plugged onto the mating contact element holder, and the two element holders are held together by friction.

11. The apparatus as claimed in claim 8, characterized in that the terminal contact element holder, in addition, retains the parts of the magnet system of the transducer axially and positions said parts radially.

12. The apparatus as claimed in claim 1, characterized in that the two terminal contact elements and the two mating contact elements are coaxial with each other.

13. The apparatus as claimed in claim 12, characterized in that the two terminal contact elements and the two mating contact elements have a substantially rotationally symmetrical construction.

14. The apparatus as claimed in claim 13, characterized in that one terminal contact element consists of a tubular metal part for positioning the parts of the magnet system in a radial direction, and two flanges each integrally connected to one end of the metal tubular part, said two flanges axially holding together the parts of the magnet system are axially held together, and the other terminal contact element consists of a contact disc facing a moving coil lead, and a contact pin integral with the contact disc, the contact pin and the contact disc being retained by a first plastic part, which, in turn, is retained inside the tubular metal part.

15. The apparatus as claimed in claim 14, characterized in that the one mating contact has a first contact tube for cooperating with the tubular metal part, and the second mating contact has a second contact tube for cooperating with the contact pin, and the second contact tube being secured by a second plastic part (87), which, in turn, is retained inside the first contact tube.

16. The apparatus as claimed in claim 15, characterized in that the printed circuit board has a hole which traverses the printed circuit board, and the first contact tube is mounted in the hole .

17. The apparatus as claimed in claim 16, characterized in that the first contact tube is retained in the hole by friction.

18. The apparatus as claimed in claim 15, characterized in that the first contact tube and the second contact tube each have a radially projecting solder portion for connecting the respective mating contact portion to a conductor track area of the printed circuit board in an electrically conductive manner by a soldered joint.

19. An electroacoustic transducer having a diaphragm, a moving coil connected to the diaphragm, and a magnet system for cooperating with the moving coil, said magnet system being coaxial with a transducer axis of the transducer, and surrounding an inner space coaxial with the transducer axis, and transducer further having two terminal contact elements for the electrically conductive connection to a moving coil lead of the moving coil, said two terminal contact elements being disposed at least partly inside the inner space in the magnet system and extending at least partly parallel to the transducer axis, characterized in that the two terminal contact elements each have a terminal contact portion extending also substantially parallel to the transducer axis and forming a part of retaining means for securing the transducer to a printed circuit board, said part acting in a direction oriented transversely to the transducer axis.

20. The transducer as claimed in claim 19, characterized in that the terminal contact portions are resilient in a direction oriented transversely to the transducer axis.

21. The transducer as claimed in claim 19, characterized in that the two terminal contact elements are disposed, at least for the greater part, in a terminal contact element holder at least in the area of their terminal contact portions, and the terminal contact portions are arranged to be accessible without being hindered by the terminal contact element holder, and the terminal contact element holder is connected to the magnet system of the transducer inside the inner space of the magnet system.

22. The transducer as claimed in claim 21, characterized in that the terminal contact element holder forms a part of mechanical retaining means for retaining the transducer on a printed circuit board, and the terminal contact portions of the two terminal contact elements in addition form parts of said retaining means and enhance the retaining function of the terminal contact element holder.

23. The transducer as claimed in claim 21, characterized in that the terminal contact element holder, in addition, radially positions the parts of the magnet system of the transducer.

24. The transducer as claimed in claim 19, characterized in that the two terminal contact elements are coaxial with each other.

25. The transducer as claimed in claim 24, characterized in that the two terminal contact elements have a substantially rotationally symmetrical construction.

26. The transducer as claimed in claim 25, characterized in that one terminal contact element consists of a tubular metal part for positioning the parts of the magnet system in a radial direction, and two flanges each integrally connected to one end of the metal tubular part, said two flanges axially holding together the parts of the magnet system, and the other terminal contact element consists of a contact disc facing a moving coil lead, and a contact pin integral with the contact disc, the contact pin (81) and the contact disc being retained by a plastic part, which, in turn, is retained inside the tubular metal part.

* * * * *